(12) United States Patent
Wang

(10) Patent No.: US 12,010,895 B2
(45) Date of Patent: Jun. 11, 2024

(54) ORGANIC LIGHT EMITTING DIODE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Lei Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 17/264,262

(22) PCT Filed: Aug. 31, 2020

(86) PCT No.: PCT/CN2020/112509
§ 371 (c)(1),
(2) Date: Mar. 10, 2023

(87) PCT Pub. No.: WO2022/007151
PCT Pub. Date: Jan. 13, 2022

(65) Prior Publication Data
US 2023/0200184 A1    Jun. 22, 2023

(30) Foreign Application Priority Data

Jul. 6, 2020    (CN) .................... 202010638515.X

(51) Int. Cl.
*G06V 40/13*    (2022.01)
*H10K 59/12*    (2023.01)
(Continued)

(52) U.S. Cl.
CPC ......... *H10K 59/65* (2023.02); *G06V 40/1318* (2022.01); *H10K 59/1201* (2023.02);
(Continued)

(58) Field of Classification Search
None
See application file for complete search history.

(56) References Cited

U.S. PATENT DOCUMENTS

2019/0026530 A1* 1/2019 Wu ................... G06V 40/1324
2019/0346939 A1    11/2019 Na et al.
(Continued)

FOREIGN PATENT DOCUMENTS

CN    109002222 A    12/2018
CN    109271829 A    1/2019
(Continued)

*Primary Examiner* — Joseph R Haley
(74) *Attorney, Agent, or Firm* — PV IP PC; Wei Te Chung; Zhigang Ma

(57) ABSTRACT

An organic light-emitting diode (OLED) display device and a manufacturing method thereof are provided. The OLED display device includes a flexible substrate, a fingerprint recognition sensor, a thin film transistor (TFT) array layer, an OLED light-emitting functional layer, a color filter layer, and a thin-film encapsulation layer. An outermost layer of the thin-film encapsulation layer is provided with a first via-hole. A collimator lens structure is embedded in the first via-hole, the collimator lens structure is configured to allow reflected light reflected by a fingerprint converged on different directions and allow the reflected light reflected in a vertical direction converged on the on the fingerprint recognition sensor.

16 Claims, 7 Drawing Sheets

(51) Int. Cl.
   *H10K 59/122* (2023.01)
   *H10K 59/38* (2023.01)
   *H10K 59/65* (2023.01)
   *H10K 59/80* (2023.01)
   *H10K 77/10* (2023.01)
   *H10K 102/00* (2023.01)

(52) U.S. Cl.
   CPC ........... *H10K 59/122* (2023.02); *H10K 59/38* (2023.02); *H10K 59/873* (2023.02); *H10K 59/8792* (2023.02); *H10K 77/111* (2023.02); *H10K 2102/311* (2023.02)

(56) References Cited

U.S. PATENT DOCUMENTS

2021/0248346 A1* 8/2021 Wu .................... G06V 40/1318
2021/0391408 A1* 12/2021 Lee ...................... H10K 59/131

FOREIGN PATENT DOCUMENTS

| CN | 109471490 A | 3/2019 |
| CN | 109472185 A | 3/2019 |
| CN | 109841661 A | 6/2019 |
| CN | 110808271 A | 2/2020 |

* cited by examiner

```
┌─────────────────────────────────────────────────────────────────────┐
│ Forming a TFT array layer on a flexible substrate, and providing a  │──S10
│ fingerprint recognition sensor on a side of the flexible substrate  │
│ away from a finger contact side                                     │
└─────────────────────────────────────────────────────────────────────┘
                                    ↓
┌─────────────────────────────────────────────────────────────────────┐
│ Forming a pixel definition layer on the TFT array layer, defining   │
│ an opening area and a non-opening area in the pixel definition      │──S20
│ layer, and sequentially forming an anode metal layer and an OLED    │
│ light-emitting layer in the opening area.                           │
└─────────────────────────────────────────────────────────────────────┘
                                    ↓
┌─────────────────────────────────────────────────────────────────────┐
│ Forming a black matrix on the pixel definition layer positioned in  │
│ the non-opening area, forming a first via-hole on the black matrix, │──S30
│ wherein the first via-hole penetrates the black matrix and exposes  │
│ the pixel definition layer, and the first via-hole is positioned    │
│ above the fingerprint recognition sensor;                           │
└─────────────────────────────────────────────────────────────────────┘
                                    ↓
┌─────────────────────────────────────────────────────────────────────┐
│ Forming forming a metal film on the black matrix and the OLED       │──S40
│ light-emitting layer, and patterning the metal film to form a       │
│ cathode metal layer.                                                │
└─────────────────────────────────────────────────────────────────────┘
                                    ↓
┌─────────────────────────────────────────────────────────────────────┐
│ Forming a first inorganic encapsulation layer on the black matrix   │
│ to allow the first inorganic encapsulation layer completely         │──S50
│ covering the cathode metal layer and filling the first via-hole,    │
│ and forming a groove in the opening area of the pixel definition    │
│ layer in the first inorganic encapsulation layer.                   │
└─────────────────────────────────────────────────────────────────────┘
                                    ↓
┌─────────────────────────────────────────────────────────────────────┐
│ Forming a color filter film in the groove through an inkjet         │
│ printing process, then sequentially forming an organic              │──S60
│ encapsulation layer and a second inorganic encapsulation layer on   │
│ the first inorganic encapsulation layer to allow the organic        │
│ encapsulation layer completely covering the color filter film.      │
└─────────────────────────────────────────────────────────────────────┘
                                    ↓
┌─────────────────────────────────────────────────────────────────────┐
│ Forming a second via-hole on a surface of the second inorganic      │
│ encapsulation layer and embedding a collimator lens structure in    │──S70
│ the second via-hole to allow the second via-hole penetrating the    │
│ second inorganic encapsulation layer and exposing the organic       │
│ encapsulation layer and positioning above the fingerprint           │
│ recognition sensor.                                                 │
└─────────────────────────────────────────────────────────────────────┘
```

FIG. 3

ORGANIC LIGHT EMITTING DIODE DISPLAY DEVICE AND MANUFACTURING METHOD THEREOF

RELATED APPLICATIONS

This application is a Notional Phase of PCT Patent Application No. PCT/CN2020/112509 having international filing date of Aug. 31, 2020, which claims the benefit of priority of Chinese Patent Application No. 202010638515.X filed on Jul. 6, 2020. The contents of the above applications are all incorporated by reference as if fully set forth herein in their entirety.

FIELD OF INVENTION

This application relates to the field of display technology, in particular to an organic light emitting diode (OLED) display device and a manufacturing method thereof.

BACKGROUND OF INVENTION

Organic light-emitting diode (OLED) device, namely organic electroluminescence display device, which has advantages of low voltage demand, high power-saving efficiency, fast response times, lightweight, thin thickness, simple structure, low cost, wide viewing angles, almost infinitely high contrast, low power consumption, and extremely fast response speed, etc. It has become one of the most important display technologies and is gradually replacing thin film transistor liquid crystal display devices (TFT-LCD), and it is expected to become a next-generation mainstream display technology after liquid crystal display (LCD) device.

Polarizer (POL) can effectively reduce the reflectivity of the panel under light illumination. However, nearly 58% of the emitted light loses. For organic light-emitting diode (OLED), this greatly increases the consumption of its service life. On the other hand, a thickness of the polarizer is thick and the material thereof is brittle, which is not conducive to the development of dynamic bendable products. In order to develop dynamic bendable products based on OLED display technology, new materials, new technologies, and new processes must be introduced to replace polarizers.

The technology of replacing polarizer (POL) with a color filter is classified as POL-less technology. It can not only reduce the thickness of the functional layer from 100 lam to less than 5 μm but also increase the light extraction rate from 42% to 60%. The POL-less technology based on the color filter is considered to be one of the key technologies to realize the development of dynamic bendable products. For the color filter after spin-coating or inkjet printing, due to its own properties, it has a high reflection effect on self-luminescence of the OLED and ambient light.

Traditional POL-less technology has been combined with Direct on-cell touch (built-in touch control) technology. However, with regard to optical fingerprint recognition, the traditional POL-less structure cannot be integrated with the optical fingerprint recognition technology due to the shading effect of the black matrix, which reduces the application range of the POL-less technology. Therefore, it is necessary to seek a new type of OLED display device and manufacturing method to solve the above-mentioned problems.

Technical Problem

In the organic light-emitting diode (OLED) display device and manufacturing method of the prior art, due to the combination of POL-less structure with optical fingerprint recognition technology, the black matrix in the color filter layer easily shades the light reflected by the finger, resulting in low recognition efficiency of the fingerprint sensor.

SUMMARY OF INVENTION

In a first aspect, an embodiment of the present application provides an organic light-emitting diode (OLED) display device, the OLED display device includes: a flexible substrate, a fingerprint recognition sensor disposed on a side of the flexible substrate away from a finger contact side, a thin film transistor (TFT) array layer disposed on the flexible substrate, an OLED light-emitting functional layer disposed on the TFT array layer, a color filter layer disposed on the OLED light-emitting functional layer, and a thin-film encapsulation layer disposed on the color filter layer.

Wherein, the fingerprint recognition sensor is configured to receive the reflected light reflected by a fingerprint, and identify the fingerprint according to the reflected light. The thin-film encapsulation layer includes a first inorganic encapsulation layer, an organic encapsulation layer, and a second inorganic encapsulation layer stacked from bottom to top, wherein a first via-hole is formed in a surface of the second inorganic encapsulation layer, the first via-hole penetrates the second inorganic encapsulation layer and exposes the organic encapsulation layer, and the first via-hole is positioned above the fingerprint recognition sensor. A collimator lens structure is embedded in the first via-hole, the collimator lens structure is configured to allow the reflected light reflected by the fingerprint converged on different directions and allow the reflected light reflected in a vertical direction converged on the fingerprint recognition sensor. The collimator lens structure is a collimator lens, and the collimator lens includes a main optical axis, and the main optical axis extends in a vertical direction.

In the OLED display device provided by the embodiment of the present application, the collimator lens is any of a convex lens, a Fresnel lens, or a microlens array.

In the OLED display device provided by the embodiment of the present application, the TFT array layer includes a barrier layer disposed on the flexible substrate, a buffer layer disposed on the barrier layer, an active layer disposed on the buffer layer, a first gate insulating layer disposed on the buffer layer and covering the active layer, a first gate metal layer disposed on the first gate insulating layer, a second gate insulating layer disposed on the first gate insulating layer and covering the first gate metal layer, a second gate metal layer disposed on the second gate insulating layer, an interlayer insulating layer disposed on the second gate insulating layer and covering the second gate metal layer, a source-drain metal layer disposed on the interlayer insulating layer, and a planarization layer disposed on the interlayer insulating layer and covering the source-drain metal layer.

In the OLED display device provided by the embodiment of the present application, a light-shielding layer is further disposed on the barrier layer, the light-shielding layer includes a first sub-light-shielding layer and a second sub-light-shielding layer, the first sub-light-shielding layer and the second sub-light-shielding layer are disposed close to both ends of the fingerprint recognition sensor, respectively.

In the OLED display device provided by the embodiment of the present application, the OLED light-emitting functional layer includes a pixel definition layer disposed on the planarization layer, an anode metal layer disposed on the planarization layer and positioned in an opening area of the pixel definition layer, an OLED light-emitting layer disposed on the anode metal layer, and a cathode metal layer disposed above the OLED light-emitting layer and the pixel definition layer.

In the OLED display device provided by the embodiment of the present application, the color filter layer includes a color filter film positioned in the opening area and a black matrix disposed on the pixel defining layer, the black matrix is disposed corresponding to a non-opening area of the pixel definition layer. The black matrix is further provided with a second via-hole, the second via-hole penetrates the black matrix and exposes the pixel definition layer, and the second via-hole is positioned above the fingerprint recognition sensor.

In the OLED display device provided by the embodiment of the present application, the cathode metal layer includes a first cathode metal layer positioned on the OLED light-emitting layer and a second cathode metal layer positioned on the black matrix.

In the OLED display device provided by the embodiment of the present application, the first inorganic encapsulation layer is positioned on the black matrix and completely covers the cathode metal layer, the first inorganic encapsulation layer further fills the second via-hole, the first inorganic encapsulation layer is provided with a groove in the opening area of the pixel definition layer; and the color filter film is formed in the groove through an inkjet printing process.

In a second aspect, an embodiment of the present application also provides an OLED display device, the OLED display device includes: a flexible substrate, a fingerprint recognition sensor disposed on a side of the flexible substrate away from a finger contact side, a thin film transistor (TFT) array layer disposed on the flexible substrate, an OLED light-emitting functional layer disposed on the TFT array layer, a color filter layer disposed on the OLED light-emitting functional layer, and a thin-film encapsulation layer disposed on the color filter layer.

Wherein, the fingerprint recognition sensor is configured to receive the reflected light reflected by a fingerprint, and identify the fingerprint according to the reflected light. The thin-film encapsulation layer includes a first inorganic encapsulation layer, an organic encapsulation layer, and a second inorganic encapsulation layer stacked from bottom to top, wherein a first via-hole is formed in a surface of the second inorganic encapsulation layer, the first via-hole penetrates the second inorganic encapsulation layer and exposes the organic encapsulation layer, and the first via-hole is positioned above the fingerprint recognition sensor. A collimator lens structure is embedded in the first via-hole, the collimator lens structure is configured to allow the reflected light reflected by the fingerprint converged on different directions and allow the reflected light reflected in a vertical direction converged on the fingerprint recognition sensor.

In the OLED display device provided by the embodiment of the present application, the TFT array layer includes a barrier layer disposed on the flexible substrate, a buffer layer disposed on the barrier layer, an active layer disposed on the buffer layer, a first gate insulating layer disposed on the buffer layer and covering the active layer, a first gate metal layer disposed on the first gate insulating layer, a second gate insulating layer disposed on the first gate insulating layer and covering the first gate metal layer, a second gate metal layer disposed on the second gate insulating layer, an interlayer insulating layer disposed on the second gate insulating layer and covering the second gate metal layer, a source-drain metal layer disposed on the interlayer insulating layer, and a planarization layer disposed on the interlayer insulating layer and covering the source-drain metal layer.

In the OLED display device provided by the embodiment of the present application, a light-shielding layer is further disposed on the barrier layer, the light-shielding layer includes a first sub-light-shielding layer and a second sub-light-shielding layer, the first sub-light-shielding layer and the second sub-light-shielding layer are disposed close to both ends of the fingerprint recognition sensor, respectively.

In the OLED display device provided by the embodiment of the present application, the OLED light-emitting functional layer includes a pixel definition layer disposed on the planarization layer, an anode metal layer disposed on the planarization layer and positioned in an opening area of the pixel definition layer, an OLED light-emitting layer disposed on the anode metal layer, and a cathode metal layer disposed above the OLED light-emitting layer and the pixel definition layer.

In the OLED display device provided by the embodiment of the present application, the color filter layer includes a color filter film positioned in the opening area and a black matrix disposed on the pixel defining layer, the black matrix is disposed corresponding to a non-opening area of the pixel definition layer. The black matrix is further provided with a second via-hole, the second via-hole penetrates the black matrix and exposes the pixel definition layer, and the second via-hole is positioned above the fingerprint recognition sensor.

In the OLED display device provided by the embodiment of the present application, the cathode metal layer includes a first cathode metal layer positioned on the OLED light-emitting layer and a second cathode metal layer positioned on the black matrix.

In the OLED display device provided by the embodiment of the present application, the first inorganic encapsulation layer is positioned on the black matrix and completely covers the cathode metal layer, the first inorganic encapsulation layer further fills the second via-hole, the first inorganic encapsulation layer is provided with a groove in the opening area of the pixel definition layer; and the color filter film is formed in the groove through an inkjet printing process.

In a third aspect, an embodiment of the present application further provides a method of manufacturing the OLED display device as described above, and the method includes:

S10, forming a TFT array layer on a flexible substrate, and providing a fingerprint recognition sensor on a side of the flexible substrate away from a finger contact side.

S20, forming a pixel definition layer on the TFT array layer, defining an opening area and a non-opening area in the pixel definition layer, and sequentially forming an anode metal layer and an OLED light-emitting layer in the opening area.

S30, forming a black matrix on the pixel definition layer positioned in the non-opening area, forming a first via-hole on the black matrix, wherein the first via-hole penetrates the black matrix and exposes the pixel definition layer, and the first via-hole is positioned above the fingerprint recognition sensor.

S40, forming a metal film on the black matrix and the OLED light-emitting layer, and patterning the metal film to form a cathode metal layer.

S50, forming a first inorganic encapsulation layer on the black matrix to allow the first inorganic encapsulation layer completely covering the cathode metal layer and filling the first via-hole, and forming a groove in the opening area of the pixel definition layer in the first inorganic encapsulation layer.

S60, forming a color filter film in the groove through an inkjet printing process, then sequentially forming an organic encapsulation layer and a second inorganic encapsulation layer on the first inorganic encapsulation layer to allow the organic encapsulation layer completely covering the color filter film.

S70, forming a second via-hole on a surface of the second inorganic encapsulation layer and embedding a collimator lens structure in the second via-hole to allow the second via-hole penetrating the second inorganic encapsulation layer and exposing the organic encapsulation layer and positioning above the fingerprint recognition sensor.

Beneficial Effect

Compared with the prior art, the OLED display device and manufacturing method disclosed by embodiments of the application provide a built-in color filter layer between an OLED light-emitting layer and a thin-film encapsulation layer, and provide a collimator lens structure disposed at a position of an outermost layer of the film encapsulation layer corresponding to a fingerprint recognition sensor. It reduces an overall thickness of the OLED display device while effectively improves recognition efficiency and recognition accuracy of the fingerprint recognition sensor in the OLED display device.

DESCRIPTION OF DRAWINGS

FIG. 3 is a flowchart of a manufacturing method of an OLED display device provided by an embodiment of the application.

DETAILED DESCRIPTION OF PREFERRED EMBODIMENTS

Figure 1:
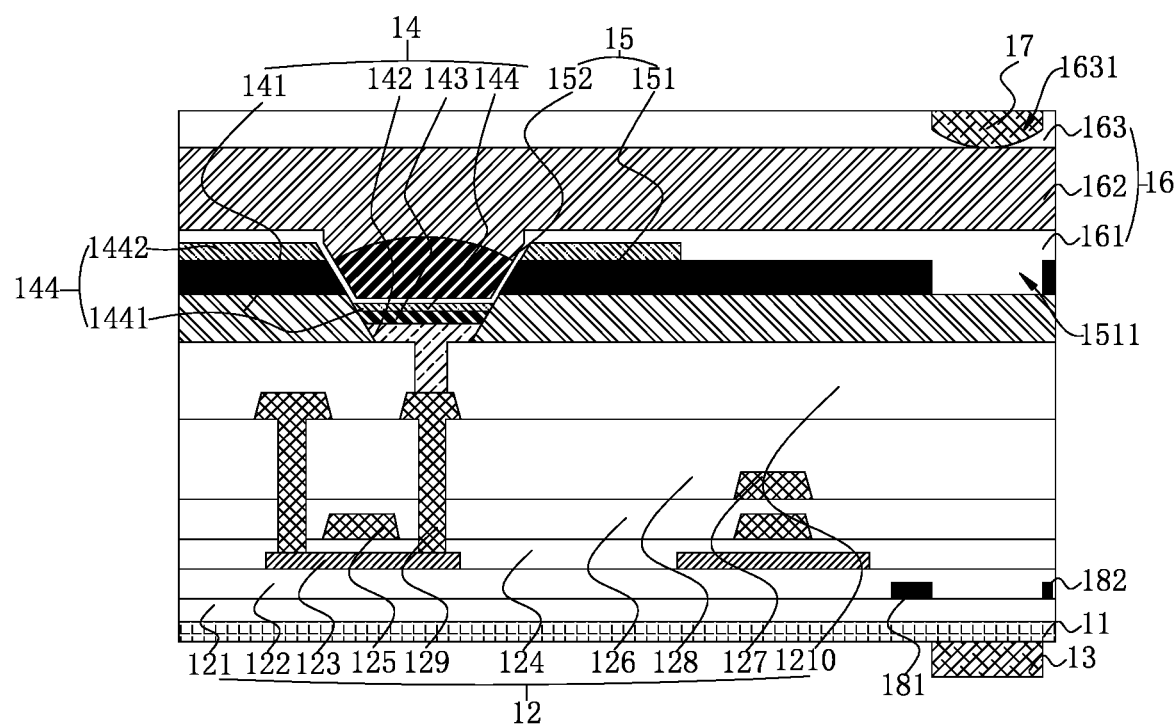
FIG. 1 is a schematic diagram of a cross-sectional structure of an OLED display device provided by an embodiment of the application.

The organic light-emitting diode (OLED) display device and manufacturing method disclosed in the embodiments of the application directed to the technical problem that since the POL-less structure is integrated with optical fingerprint recognition technology, the black matrix in the color filter layer easily blocks the reflected light reflected by a finger, resulting in low recognition efficiency of the fingerprint sensor. This embodiment can solve this defect. As shown in FIG. 1, it is a schematic diagram of a cross-sectional structure of an OLED display device provided by an embodiment of this application. Each component in the embodiment of the present application and their relative position relationship between each component can be seen intuitively from the figure.

Specifically, the OLED display device includes a flexible substrate 11, a fingerprint recognition sensor 13 disposed on a side of the flexible substrate 11 away from a finger contact side, a TFT array layer 12 disposed on the flexible substrate 11, an OLED light-emitting functional layer 14 disposed on the TFT array layer 12, a color filter layer 15 disposed on the OLED light-emitting functional layer 14, and a thin-film encapsulation layer 16 disposed on the color filter layer 15.

Wherein, the fingerprint recognition sensor 13 is configured to receive reflected light reflected by a fingerprint, and identify the fingerprint according to the reflected light. The thin-film encapsulation layer 16 includes a first inorganic encapsulation layer 161, an organic encapsulation layer 162, and a second inorganic encapsulation layer 163 stacked from bottom to top, wherein a first via-hole 1631 is formed in a surface of the second inorganic encapsulation layer 163, the first via-hole 1631 penetrates the second inorganic encapsulation layer 163 and exposes the organic encapsulation layer 162, and the first via-hole 1631 is positioned above the fingerprint recognition sensor 13. A collimator lens structure 17 is embedded in the first via-hole 1631, the collimator lens structure 17 is configured to allow the reflected light reflected by the fingerprint converged on different directions and allow the reflected light reflected in a vertical direction converged on the fingerprint recognition sensor 13.

Further, the collimator lens structure 17 is a collimator lens, so that the collimator lens structure 17 can allow light to pass through. The collimator lens has a main optical axis, and the main optical axis extends in a vertical direction. Thus, the light reflected from the finger in the vertical direction is parallel to the main optical axis.

Further, the collimator lens is any of a convex lens, a Fresnel lens, or a microlens array. Among them, the convex lens is a lens with a thicker center and a thinner edge; the Fresnel lens can be a sheet made of polyolefin material by injection molding, or it can be made of glass. One side of the Fresnel lens is a smooth surface, and the other side of the Fresnel lens is engraved with concentric circles from small to large. The microlens array is an array composed of lenses with aperture and a micron-level relief depth. The microlens not only has basic functions such as focusing and imaging but also has the characteristics of small size and high integration.

Specifically, the material of the flexible substrate 11 is polyimide, wherein polyimide has high transparency and low reflectivity and has good thermal stability. The material of the collimator lens structure 17 is organic resin.

Specifically, the TFT array layer 12 includes a barrier layer 121 disposed on the flexible substrate 11, a buffer layer 122 disposed on the barrier layer 121, an active layer 123 disposed on the buffer layer 122, a first gate insulating layer 124 disposed on the buffer layer 122 and covering the active layer 123, a first gate metal layer 125 disposed on the first gate insulating layer 124, a second gate insulating layer 126 disposed on the first gate insulating layer 124 and covering the first gate metal layer 125, a second gate metal layer 127 disposed on the second gate insulating layer 126, an interlayer insulating layer 128 disposed on the second gate insulating layer 126 and covering the second gate metal layer 127, a source-drain metal layer 129 disposed on the interlayer insulating layer 128, and a planarization layer 1210 disposed on the interlayer insulating layer 128 and covering the source-drain metal layer 129. Wherein, the source-drain metal layer 129 is connected to both ends of the active layer 123 through via-holes on the second gate insulating layer 126.

Further, the material of the barrier layer 121, the buffer layer 122, the first gate insulating layer 124, the second gate insulating layer 126, the interlayer insulating layer 128, and the planarization layer 1210 is selected from at least one of $SiN_x$ or $SiO_x$.

Further, the materials of the first gate metal layer 125, the second gate metal layer 127, and the source-drain metal layer 129 are all manufactured from the first metal layer, which can effectively reduce the manufacturing cost. The first metal layer includes at least one of molybdenum (Mo), titanium (Ti), copper (Cu), or nickel (Ni). The material of the active layer 123 is selected form any of indium gallium zinc oxide (IGZO), indium tin zinc oxide (ITZO), or indium gallium zinc tin oxide (IGZTO).

Specifically, the OLED light-emitting functional layer 14 includes a pixel definition layer 141 disposed on the planarization layer 1210, an anode metal layer 142 disposed on the planarization layer 1210 and positioned in an opening area of the pixel definition layer 141, an OLED light-emitting layer 143 disposed on the anode metal layer 142, and a cathode metal layer 144 disposed above the OLED light-emitting layer 143 and the pixel definition layer 141.

The cathode metal layer 144 includes a first cathode metal layer 1441 positioned on the OLED light-emitting layer 143 and a second cathode metal layer 1442 positioned on the black matrix 151. The first inorganic encapsulation layer 161 is positioned on the black matrix 151 and completely covers the cathode metal layer 144, the first inorganic encapsulation layer 161 also fills the second via-hole 1511, and the first inorganic encapsulation layer 161 is provided with a groove in the opening area of the pixel definition layer 141. The color filter film 152 is formed in the groove through an inkjet printing process.

Specifically, a light-shielding layer is further disposed on the barrier layer 121, and the light-shielding layer includes a first sub-light-shielding layer 181 and a second sub-light-shielding layer 182. The first light-shielding layer 181 and the second light-shielding layer 182 are respectively close to two ends of the edge of the fingerprint recognition sensor. The material of the light-shielding layer is the same as that of the black matrix 151.

Specifically, the materials of the first inorganic encapsulation layer 161 and the second inorganic encapsulation layer 163 are both silicon nitride ($SiN_x$), and the material of the organic encapsulation layer 162 is organic photoresist.

Figure 2:
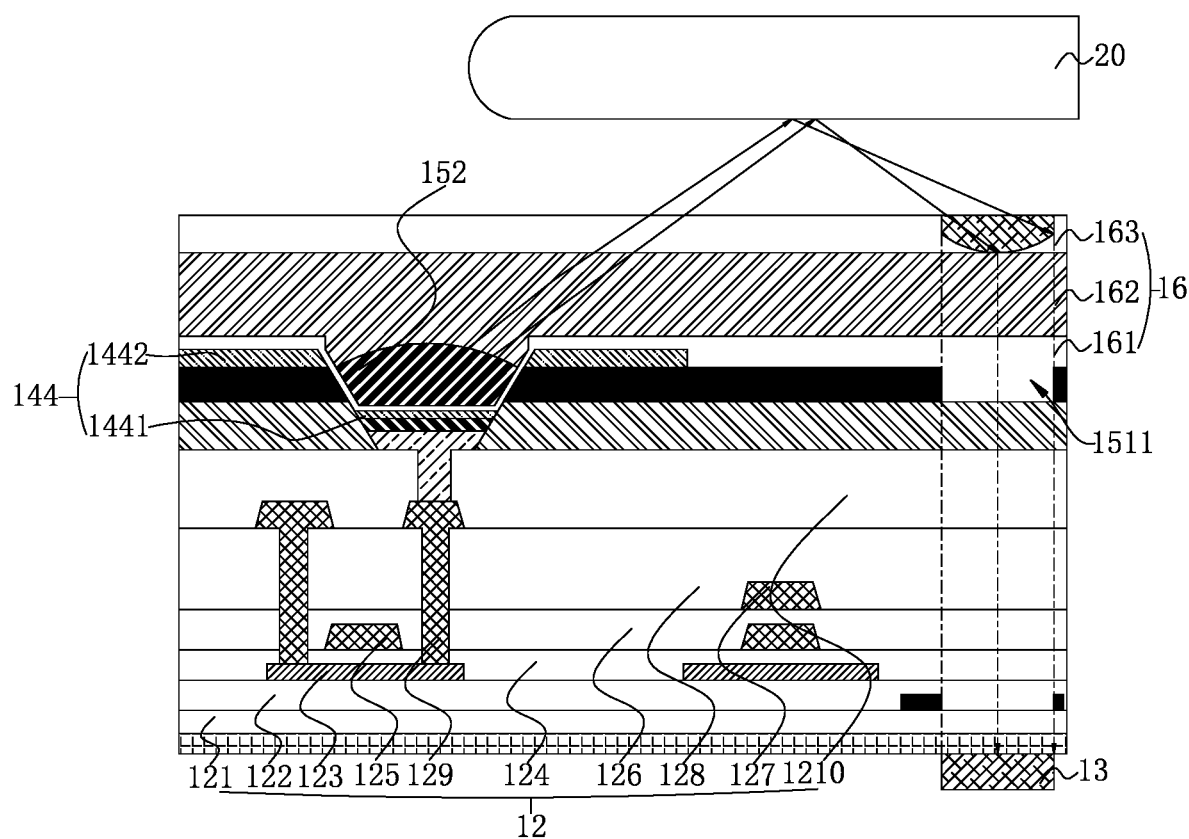
FIG. 2 is a light path diagram in an OLED display device provided by an embodiment of the application.

FIG. 2 shows a light path diagram of the OLED display device provided by an embodiment of the application. The emitted light emitted by the OLED light-emitting layer 152 is reflected by a finger 20 to the collimator lens structure 17, and the collimator lens structure 17 allows the reflected light energy converge in different directions. In addition, the light reflected in vertical direction can be converged on the fingerprint recognition sensor 13 to prevent the light from being reflected at different directions and to be absorbed, so as to increase the signal amount of the received light. In addition, the collimator lens structure 17 plays a role in filtering stray light to a certain extent and can improve the signal-to-noise ratio of the collected data, thereby effectively improving the recognition efficiency and recognition accuracy of the fingerprint recognition sensor 13. On the other hand, the light-shielding layer provided on the barrier layer 121 can effectively prevent stray light from being incident on the fingerprint recognition sensor 13, and further improve the signal-to-noise ratio of the collected data.

In an embodiment of the application, the black matrix of the POL-less technology is built into the array structure, and a collimator structure is disposed on the upper layer of the thin-film encapsulation layer. It not only reduces the overall thickness of the OLED display device but also effectively improves the recognition efficiency and recognition accuracy of the fingerprint recognition sensor in the OLED display device.

As shown in FIG. 3, a flow chart of a method of manufacturing an OLED display device provided by an embodiment of this application, wherein the method includes:

S10, a TFT array layer is formed 12 on a flexible substrate 11, and a fingerprint recognition sensor 13 is provided on a side of the flexible substrate 11 away from a finger contact side.

Figure 4A:
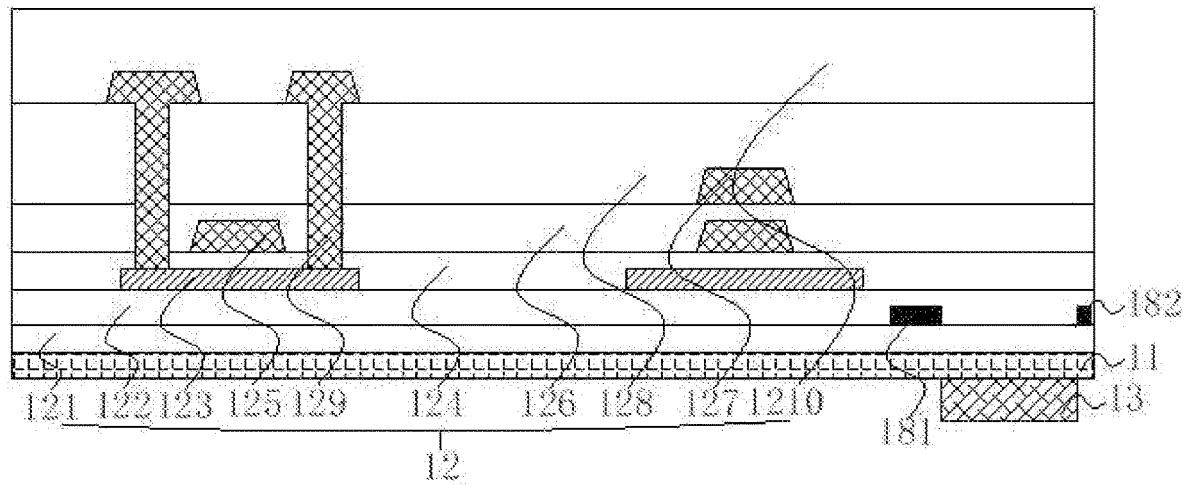
FIG. 4A to 4G are schematic structural diagrams of a manufacturing method of an OLED display device provided by an embodiment of the application.

Specifically, the S10 further includes: First, the TFT array layer 12 is formed on a flexible substrate 11. Following, a fingerprint recognition sensor 13 is provided on the side of the flexible substrate 11 away from the finger contact side. The fingerprint recognition sensor 13 is configured to receive the reflected light reflected by the fingerprint and recognize the fingerprint based on the reflected light, as shown in FIG. 4A.

Specifically, the material of the flexible substrate 11 is polyimide, wherein polyimide has high transparency and low reflectivity and has good thermal stability.

Specifically, the TFT array layer includes a barrier layer 121 disposed on the flexible substrate 11, a buffer layer 122 disposed on the barrier layer 121, an active layer 123 disposed on the buffer layer 122, a first gate insulating layer 124 disposed on the buffer layer 122 and covering the active layer 123, a first gate metal layer 125 disposed on the first gate insulating layer 124, a second gate insulating layer 126 disposed on the first gate insulating layer 124 and covering the first gate metal layer 125, a second gate metal layer 127 disposed on the second gate insulating layer 126, an interlayer insulating layer 128 disposed on the second gate insulating layer 126 and covering the second gate metal layer 127, a source-drain metal layer 129 disposed on the interlayer insulating layer 128, and a planarization layer 1210 disposed on the interlayer insulating layer 128 and covering the source-drain metal layer 129. The source-drain metal layer 129 is connected to both ends of the active layer 123 through via-holes on the second gate insulating layer 126. The barrier layer 121 is further provided with a light-shielding layer, the light-shielding layer includes a first sub-light-shielding layer 181 and a second sub-light-shielding layer 182, the first sub-light-shielding layer 181 and the second sub-light-shielding layer 182 are respectively close to both ends of the edge of the fingerprint recognition sensor 13.

Further, materials of the barrier layer 121, the buffer layer 122, the first gate insulating layer 124, the second gate insulating layer 126, the interlayer insulating layer 128, and the planarization layer 1210 are selected from at least one of silicon nitride ($SiN_x$) or silicon oxide ($SiO_x$).

Further, the materials of the first gate metal layer 125, the second gate metal layer 127, and the source-drain metal layer 129 are all manufactured from the first metal layer, which can effectively reduce the manufacturing cost. The first metal layer includes at least one of molybdenum (Mo), titanium (Ti), copper (Cu), or nickel (Ni). The material of the active layer 123 is selected form any of indium gallium zinc oxide (IGZO), indium tin zinc oxide (ITZO), or indium gallium zinc tin oxide (IGZTO).

S20, a pixel definition layer 141 is formed on the TFT array layer 12, an opening area 1411 and a non-opening area 1412 are defined in the pixel definition layer 141, and an anode metal layer 142 and an OLED light-emitting layer 143 are sequentially formed in the opening area 1411.

Figure 4B:
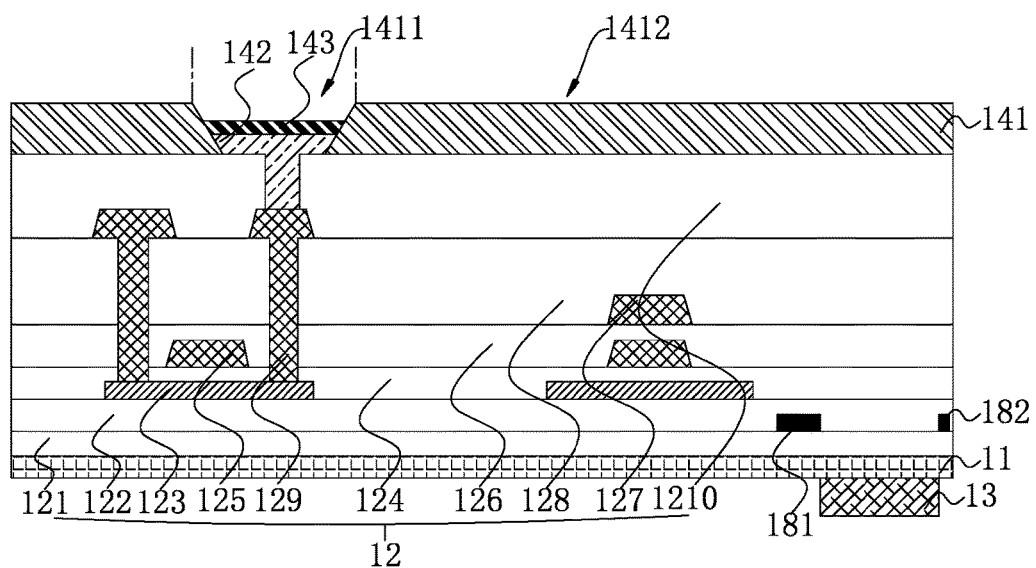

Specifically, the S20 further includes:
First, a pixel definition layer 141 is formed on the TFT array layer 12, an opening area 1411 and a non-aperture area 1412 are defined in the pixel definition layer 141, and an anode metal layer 142 and an OLED light-emitting layer 143 are sequentially formed in the opening area 1411, as shown in FIG. 4B.

Specifically, a pixel definition layer 141 is formed on the TFT array layer 12, an opening area 1411 and a non-opening area 1412 are defined in the pixel definition layer 141, and an anode metal layer 142 and an OLED light-emitting layer 143 are sequentially formed in the opening area 1411. Wherein, the anode metal layer 142 is connected to the source-drain metal layer 129 through via-holes in the planarization layer 1210.

S30, a black matrix 151 is formed on the pixel definition layer 141 positioned in the non-opening area 1412, a first via-hole 1511 is formed on the black matrix 151, wherein the first via-hole 1511 penetrates the black matrix 151 and exposes the pixel definition layer 141, and the first via-hole 1511 is positioned above the fingerprint recognition sensor 13.

Figure 4C:
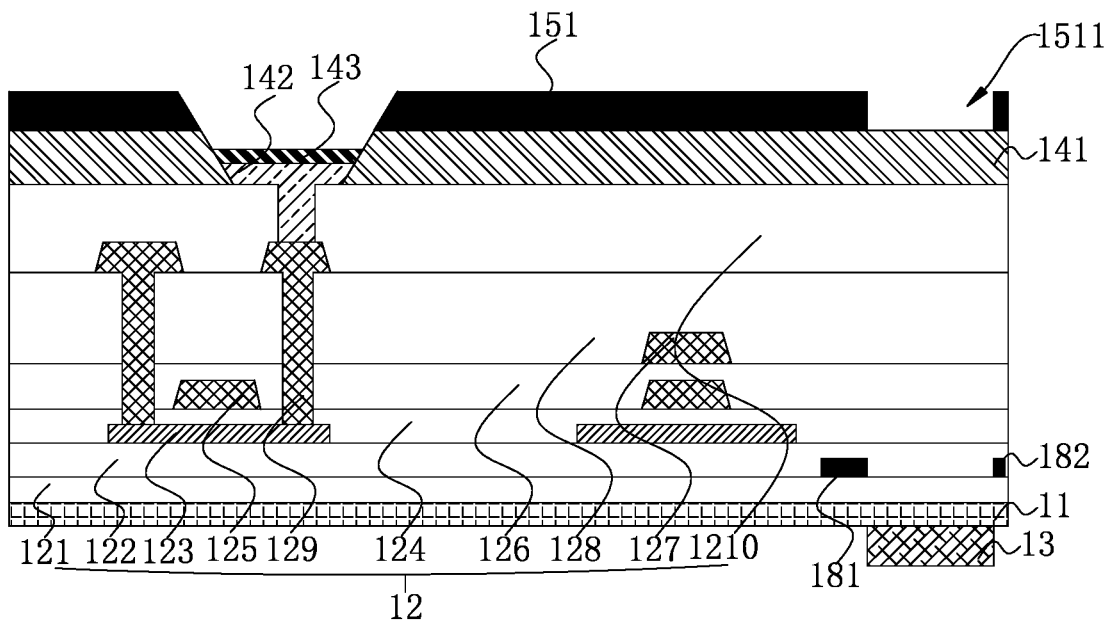

Specifically, the S30 further includes: a black matrix 151 is formed on the pixel definition layer 141 positioned in the non-opening area 1412, a first via-hole 1511 is further formed on the black matrix 151, wherein the first via-hole 1511 penetrates the black matrix 151 and exposes the pixel definition layer 141, and the first via-hole 1511 is positioned above the fingerprint recognition sensor 13, as shown in FIG. 4C.

S40, a metal film is formed on the black matrix 151 and the OLED light-emitting layer 143, and the metal film is patterned to form a cathode metal layer 144.

Figure 4D:
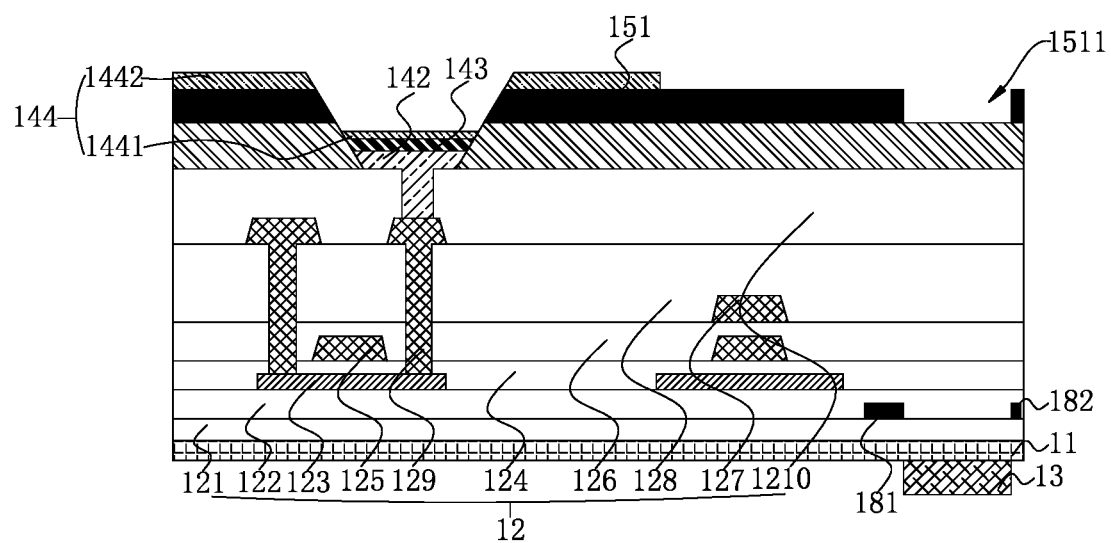

Specifically, the S40 further includes:

A metal film is deposited on the black matrix 151 and the OLED light-emitting layer 143, and the metal film is patterned to form a cathode metal layer 144. The cathode metal layer 144 includes a first cathode metal layer 1441 on the OLED light-emitting layer 143 and a second cathode metal layer 1442 on the black matrix 151, the second cathode metal layer 1442 does not cover the first through-hole 1511, as shown in FIG. 4D.

S50, a first inorganic encapsulation layer 161 is formed on the black matrix 151, the first inorganic encapsulation layer 161 completely covers the cathode metal layer 144 and fills the first via-hole 1511, and a groove 1611 is included in the opening area 1411 of the pixel definition layer 141 in the first inorganic encapsulation layer 161.

Figure 4E:
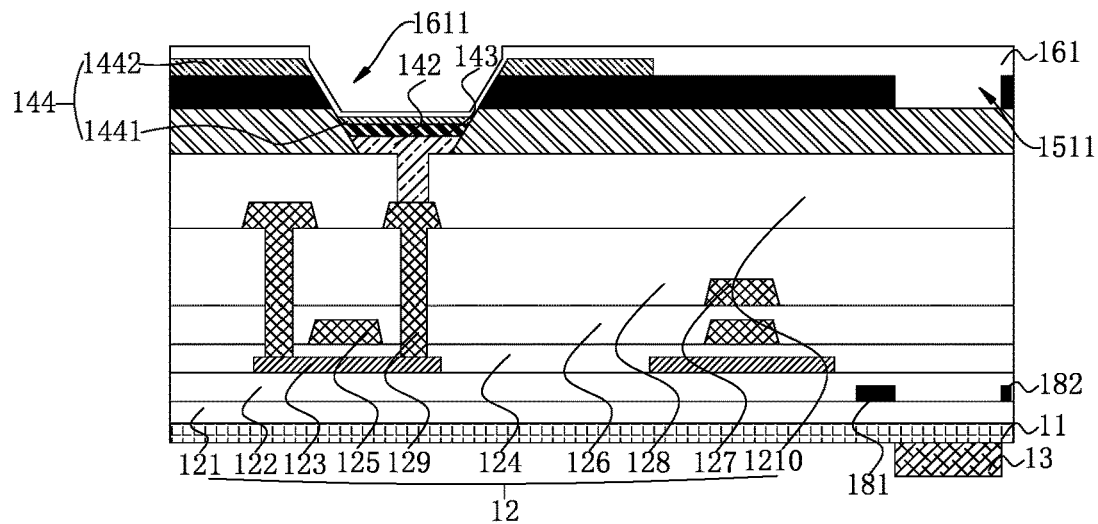

Specifically, the S50 further includes:

A first inorganic encapsulation layer 161 is formed on the black matrix 151, the first inorganic encapsulation layer 161 completely covers the cathode metal layer 144 and fills the first via-hole 1511, and a groove 1611 is included in the opening area 1411 of the pixel definition layer 141 in the first inorganic encapsulation layer 161. Wherein, the material of the first inorganic encapsulation layer 161 is $SiN_x$, as shown in FIG. 4E.

S60, a color filter film 152 is formed in the groove 1611 through an inkjet printing process, then an organic encapsulation layer 162 and a second inorganic encapsulation layer 163 are sequentially formed on the first inorganic encapsulation layer 161 to allow the organic encapsulation layer 163 completely covering the color filter film 152.

Figure 4F:
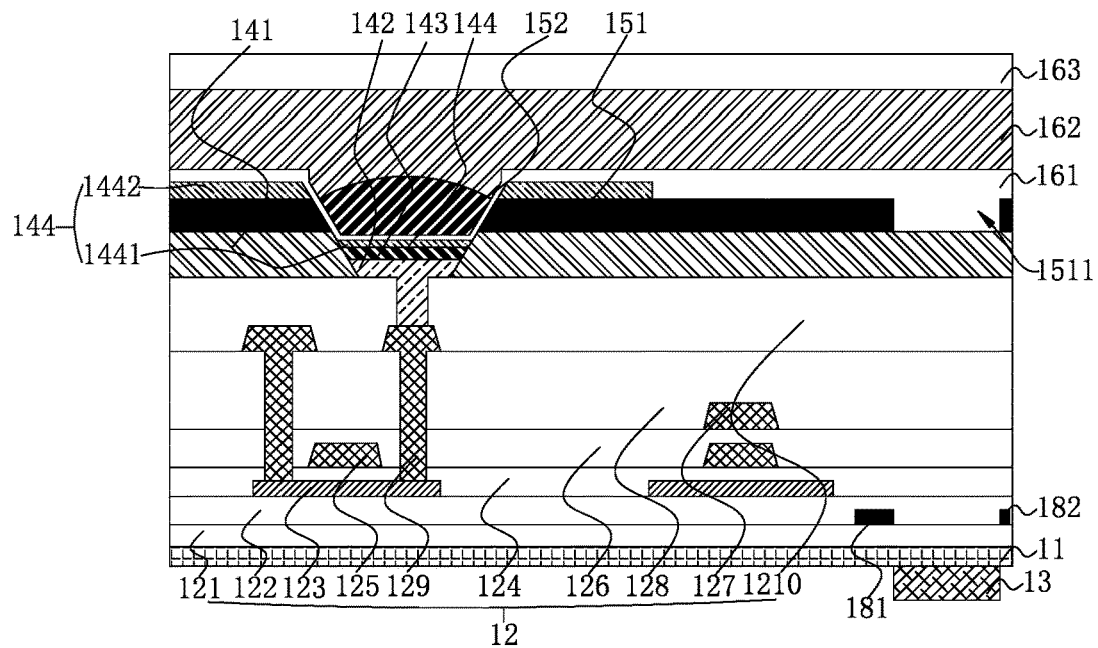

Specifically, the S60 further includes:

A color filter film 152 is formed in the groove 1611 through an inkjet printing process, following an organic encapsulation layer 162 and a second inorganic encapsulation layer 163 are sequentially formed on the first inorganic encapsulation layer 161 to allow the organic encapsulation layer 163 completely covering the color filter film 152. Wherein, the organic encapsulation layer 162 is formed by inkjet printing, and the material of the second inorganic encapsulation layer 163 is $SiN_x$, and the material of the organic encapsulation layer 162 is an organic photoresist, as shown in FIG. 4F.

S70, a second via-hole 1631 is formed on a surface of the second inorganic encapsulation layer 163 and a collimator lens structure 17 is embedded in the second via-hole 1631 to allow the second via-hole 1631 penetrating the second inorganic encapsulation layer 163 and exposing the organic encapsulation layer 162, and the second via-hole 1631 is positioned above the fingerprint recognition sensor 13.

Figure 4G:
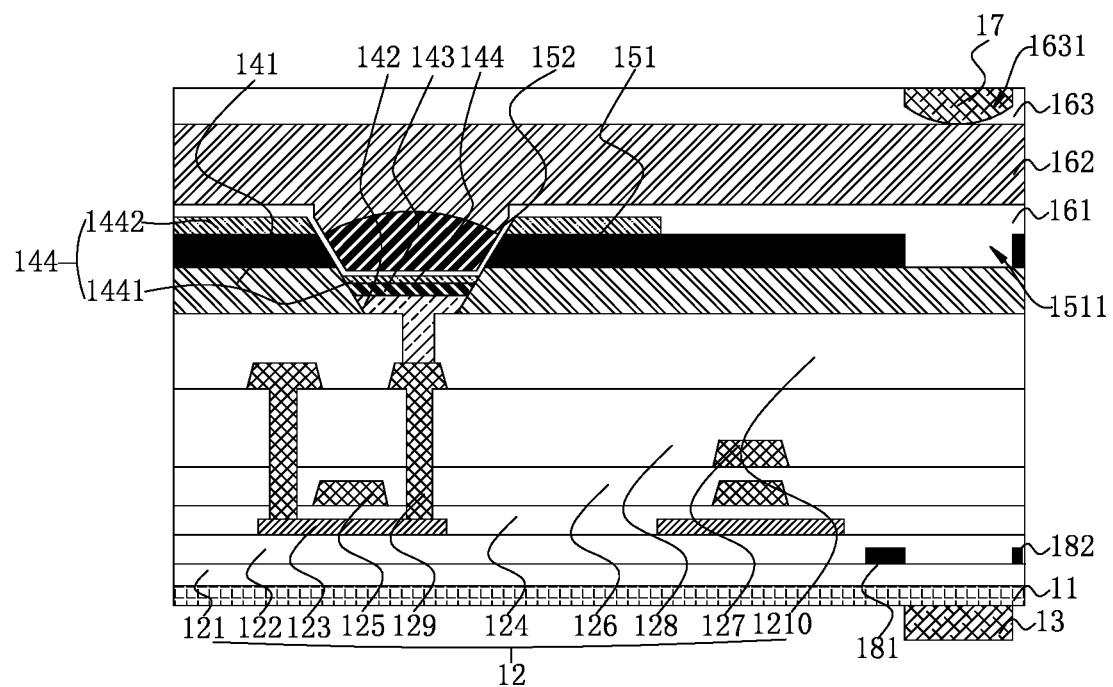

Specifically, the S70 further includes:

First, by using the grayscale exposure method, photoresists of different thicknesses are formed on a surface of the second inorganic encapsulation layer 163 positioned above the fingerprint recognition sensor 13. Following a second via-hole 1631 with different thicknesses is formed by etching, and the second via-hole 1631 penetrates the second inorganic encapsulation layer 163 and exposes the organic encapsulation layer 162. Finally, an organic resin material is filled in the second via-hole 1631 to form the collimator structure 17. When the light emitted by the OLED light-emitting layer 143 is shielded by fingerprints, the reflected light can be collimated into the fingerprint recognition sensor 13 through the collimator lens structure 17, to prevent the light from being reflected at different directions and to be absorbed, so as to increase the signal amount of the received light. In addition, the collimator lens structure 17 plays a role in filtering stray light to a certain extent and can improve the signal-to-noise ratio of the collected data, as shown in FIG. 4G.

Further, the collimator lens structure 17 is a collimator lens, so that the collimator lens structure 17 can allow light to pass through. The collimator lens has a main optical axis, and the main optical axis extends in a vertical direction. Thus, the light reflected from the finger in the vertical direction is parallel to the main optical axis.

Further, the collimator lens is any of a convex lens, a Fresnel lens, or a microlens array. Among them, the convex lens is a lens with a thicker center and a thinner edge; the Fresnel lens can be a sheet made of polyolefin material by injection molding, or it can be made of glass. One side of the Fresnel lens is a smooth surface, and the other side of the Fresnel lens is engraved with concentric circles from small to large. The microlens array is an array composed of lenses with aperture and a micron-level relief depth. The microlens not only has basic functions such as focusing and imaging but also has the characteristics of small size and high integration.

For the specific implementation of the above operations, please refer to the previous embodiments, which will not be repeated here.

As described above, the OLED display device and manufacturing method disclosed by embodiments of the application provide a color filter layer between an OLED light-emitting layer and a thin-film encapsulation layer and provide a built-in collimator lens structure at a position of an outermost layer of the film encapsulation layer corresponding to a fingerprint recognition sensor. It reduces an overall thickness of the OLED display device while effectively improves recognition efficiency and recognition accuracy of the fingerprint recognition sensor in the OLED display device.

It can be understood that for those of ordinary skill in the art, equivalent substitutions or modifications can be made according to the technical solutions and inventive concepts of the present application, and all these modifications or substitutions shall fall within the protection scope of claims of the present application.

What is claimed is:

1. An organic light-emitting diode (OLED) display device, comprising:
a flexible substrate;
a thin film transistor (TFT) array layer disposed on the flexible substrate;
an OLED light-emitting functional layer disposed on the TFT array layer;
a color filter layer disposed on the OLED light-emitting functional layer;
a thin-film encapsulation layer disposed on the color filter layer, and the thin-film encapsulation layer comprising a first inorganic encapsulation layer, an organic encapsulation layer, and a second inorganic encapsulation layer stacked from bottom to top, wherein a first via-hole is formed in a surface of the second inorganic encapsulation layer, the first via-hole penetrates the second inorganic encapsulation layer and exposes the organic encapsulation layer, and the first via-hole is positioned above the fingerprint recognition sensor;
a fingerprint recognition sensor disposed on a side of the flexible substrate away from a finger contact side to receive reflected light reflected by a fingerprint, and identify the fingerprint according to the reflected light;
wherein a collimator lens structure is embedded in the first via-hole, the collimator lens structure is configured to allow the reflected light reflected by the fingerprint converged on different directions and allow the reflected light reflected in a vertical direction converged on the fingerprint recognition sensor; the collimator lens structure is a collimator lens, and the collimator lens comprises a main optical axis, and the main optical axis extends in a vertical direction.

2. The OLED display device according to claim 1, wherein the collimator lens is selected form any of a convex lens, a Fresnel lens, or a microlens array.

3. The OLED display device according to claim 1, wherein the TFT array layer comprises a barrier layer disposed on the flexible substrate, a buffer layer disposed on the barrier layer, an active layer disposed on the buffer layer, a first gate insulating layer disposed on the buffer layer and covering the active layer, a first gate metal layer disposed on the first gate insulating layer, a second gate insulating layer disposed on the first gate insulating layer and covering the first gate metal layer, a second gate metal layer disposed on the second gate insulating layer, an interlayer insulating layer disposed on the second gate insulating layer and covering the second gate metal layer, a source-drain metal layer disposed on the interlayer insulating layer, and a planarization layer disposed on the interlayer insulating layer and covering the source-drain metal layer.

4. The OLED display device according to claim 3, wherein a light-shielding layer is further disposed on the barrier layer, the light-shielding layer comprises a first sub-light-shielding layer and a second sub-light-shielding layer, the first sub-light-shielding layer and the second sub-light-shielding layer are disposed close to both ends of the fingerprint recognition sensor, respectively.

5. The OLED display device according to claim 3, wherein the OLED light-emitting functional layer comprises a pixel definition layer disposed on the planarization layer, an anode metal layer disposed on the planarization layer and positioned in an opening area of the pixel definition layer, an OLED light-emitting layer disposed on the anode metal layer, and a cathode metal layer disposed above the OLED light-emitting layer and the pixel definition layer.

6. The OLED display device according to claim 5, wherein the color filter layer comprises a color filter film positioned in the opening area and a black matrix disposed on the pixel defining layer, the black matrix is disposed corresponding to a non-opening area of the pixel definition layer; the black matrix is further provided with a second via-hole, the second via-hole penetrates the black matrix and exposes the pixel definition layer and first via-hole is positioned above the fingerprint recognition sensor.

7. The OLED display device according to claim 6, wherein the cathode metal layer comprises a first cathode metal layer positioned on the OLED light-emitting layer and a second cathode metal layer positioned on the black matrix.

8. The OLED display device according to claim 6, wherein the first inorganic encapsulation layer is positioned on the black matrix and completely covers the cathode metal layer, the first inorganic encapsulation layer further fills the second via-hole, the first inorganic encapsulation layer is provided with a groove in the opening area of the pixel definition layer; and the color filter film is formed in the groove through an inkjet printing process.

9. An OLED display device, comprising:
a flexible substrate;
a TFT array layer disposed on the flexible substrate;
an OLED light-emitting functional layer disposed on the TFT array layer;
a color filter layer disposed on the OLED light-emitting functional layer;
a thin-film encapsulation layer disposed on the color filter layer, and the thin-film encapsulation layer comprising a first inorganic encapsulation layer, an organic encapsulation layer, and a second inorganic encapsulation layer stacked from bottom to top, wherein a first via-hole is formed in a surface of the second inorganic encapsulation layer, the first via-hole penetrates the second inorganic encapsulation layer and exposes the organic encapsulation layer, and the first via-hole is positioned above the fingerprint recognition sensor;
a fingerprint recognition sensor disposed on a side of the flexible substrate away from a finger contact side to receive reflected light reflected by a fingerprint, and identify the fingerprint according to the reflected light;
wherein a collimator lens structure is embedded in the first via-hole, the collimator lens structure is configured to allow the reflected light reflected by the fingerprint converged on different directions and allow the reflected light reflected in a vertical direction converged on the fingerprint recognition sensor.

10. The OLED display device according to claim 9, wherein the TFT array layer comprises a barrier layer disposed on the flexible substrate, a buffer layer disposed on the barrier layer, an active layer disposed on the buffer layer, a first gate insulating layer disposed on the buffer layer and covering the active layer, a first gate metal layer disposed on the first gate insulating layer, a second gate insulating layer disposed on the first gate insulating layer and covering the first gate metal layer, a second gate metal layer disposed on the second gate insulating layer, an interlayer insulating layer disposed on the second gate insulating layer and covering the second gate metal layer, a source-drain metal layer disposed on the interlayer insulating layer, and a planarization layer disposed on the interlayer insulating layer and covering the source-drain metal layer.

11. The OLED display device according to claim 10, wherein a light-shielding layer is further disposed on the barrier layer, the light-shielding layer comprises a first sub-light-shielding layer and a second sub-light-shielding layer, the first sub-light-shielding layer and the second sub-light-shielding layer are disposed close to both ends of the fingerprint recognition sensor, respectively.

12. The OLED display device according to claim 10, wherein the OLED light-emitting functional layer comprises a pixel definition layer disposed on the planarization layer, an anode metal layer disposed on the planarization layer and positioned in an opening area of the pixel definition layer, an OLED light-emitting layer disposed on the anode metal layer, and a cathode metal layer disposed above the OLED light-emitting layer and the pixel definition layer.

13. The OLED display device according to claim 12, wherein the color filter layer comprises a color filter film positioned in the opening area and a black matrix disposed on the pixel defining layer, the black matrix is disposed corresponding to a non-opening area of the pixel definition layer; the black matrix is further provided with a second via-hole, the second via-hole penetrates the black matrix and exposes the pixel definition layer, and the second via-hole is positioned above the fingerprint recognition sensor.

14. The OLED display device according to claim 13, wherein the cathode metal layer comprises a first cathode metal layer positioned on the OLED light-emitting layer and a second cathode metal layer positioned on the black matrix.

15. The OLED display device according to claim 13, wherein the first inorganic encapsulation layer is positioned on the black matrix and completely covers the cathode metal layer, the first inorganic encapsulation layer further fills the second via-hole, the first inorganic encapsulation layer is provided with a groove in the opening area of the pixel definition layer; and the color filter film is formed in the groove through an inkjet printing process.

16. A method of manufacturing the OLED display device of claim 9, wherein the method comprises:

S10, forming a TFT array layer on a flexible substrate, and providing a fingerprint recognition sensor on a side of the flexible substrate away from a finger contact side;

S20, forming a pixel definition layer on the TFT array layer, defining an opening area and a non-opening area in the pixel definition layer, and sequentially forming an anode metal layer and an OLED light-emitting layer in the opening area;

S30, forming a black matrix on the pixel definition layer positioned in the non-opening area, forming a first via-hole on the black matrix, wherein the first via-hole penetrates the black matrix and exposes the pixel definition layer, and the first via-hole is positioned above the fingerprint recognition sensor;

S40, forming a metal film on the black matrix and the OLED light-emitting layer, and patterning the metal film to form a cathode metal layer;

S50, forming a first inorganic encapsulation layer on the black matrix to allow the first inorganic encapsulation layer completely covering the cathode metal layer and filling the first via-hole, and forming a groove in the opening area of the pixel definition layer in the first inorganic encapsulation layer;

S60, forming a color filter film in the groove through an inkjet printing process, then sequentially forming an organic encapsulation layer and a second inorganic encapsulation layer on the first inorganic encapsulation layer to allow the organic encapsulation layer completely covering the color filter film; and S70, forming a second via-hole on a surface of the second inorganic encapsulation layer and embedding a collimator lens structure in the second via-hole to allow the second via-hole penetrating the second inorganic encapsulation layer and exposing the organic encapsulation layer and positioning above the fingerprint recognition sensor.

* * * * *